United States Patent [19]
Vaerewyck et al.

[11] Patent Number: 4,613,811
[45] Date of Patent: Sep. 23, 1986

[54] FARADAY CURRENT SENSOR WITH FIBER OPTIC COMPENSATED BY TEMPERATURE, DEGRADATION, AND LINEARITY

[75] Inventors: Eugene G. Vaerewyck, Albuquerque, N. Mex.; Cheng-Lin Chen, Pittsburgh; Juris A. Asars, Murrysville, both of Pa.

[73] Assignee: Westinghouse Electric Corp., Pittsburgh, Pa.

[21] Appl. No.: 647,203

[22] Filed: Sep. 4, 1984

[51] Int. Cl.$^4$ .......................... G01R 15/07; G02F 1/09
[52] U.S. Cl. ...................... 324/96; 324/105; 350/376; 350/377; 356/368
[58] Field of Search .................. 324/96, 105; 356/368; 350/374, 375, 376, 377, 378

[56] References Cited

U.S. PATENT DOCUMENTS

| 3,784,281 | 3/1973 | Kuse | 350/377 X |
| 4,563,639 | 1/1986 | Langeac | 324/96 |
| 4,564,754 | 1/1986 | Sato et al. | 324/96 X |

FOREIGN PATENT DOCUMENTS 562453  5/1975  Switzerland .................. 350/377

OTHER PUBLICATIONS

Erickson, D., "The Use of Fiber Optics for Communications, Measurement and Control Within High Voltage Substations" IEEE Trans., vol. PAS-99, No. 3, May, 1980.

Primary Examiner—Reinhard J. Eisenzopf
Assistant Examiner—Stephen M. Baker
Attorney, Agent, or Firm—L. P. Johns

[57] ABSTRACT

A magneto-optical current sensor for measuring current flowing through a conductor, characterized by at least two components. One component is parallel to the direction of current flow and is proximate to a source of magnetic field. The other component is perpendicular to that direction and includes a surface in contact with said one component. One of the components having a reflective surface for reflecting a polarized light beam between components whereby a light signal is produced that is compensated for temperature, loop degradation, and linearity.

5 Claims, 7 Drawing Figures

FARADAY CURRENT SENSOR WITH FIBER OPTIC COMPENSATED BY TEMPERATURE, DEGRADATION, AND LINEARITY

CROSS-REFERENCE TO RELATED APPLICATIONS

This application is related to the copending applications filed concurrently herewith, including Ser. No. 647,201, filed Sept. 4, 1984, and Ser. No. 647,202, filed Sept. 4, 1984, now abandoned, of similar inventors and assigned to the present assignee.

BACKGROUND OF THE INVENTION

1. Field of the Invention

This invention relates to magneto-optical current sensors that utilize the Faraday effect with fiber optics and, more particularly, it pertains to such sensors compensated for temperature, degradation, and linearity.

2. Description of the Prior Art

The Faraday effect specifies that when a plane polarized beam of light passes through certain transparent substances along the lines of a strong magnetic field, the plane of polarization of the emergent light is different from that of the incident light. That effect has been employed in magneto-optical material to measure current in an electrical conductor. For that purpose a Faraday rotator current sensor is used and involves inherent temperature characteristics of the material's Verdet constant.

There are applications that require optical current sensing accuracies better than the 1/T temperature coefficient and $\cos^2\chi$ linearity of an uncorrected Faraday sensor biased at 45°. There is a need for a modified Faraday current sensor and associated electronic circuitry to provide compensation for temperature loop degradation, and linearity.

SUMMARY OF THE INVENTION

In accordance with this invention it has been found that a current sensor having compensation for temperature, loop degradation, and linearity may be provided and comprises a body of magneto-optical material within the magnetic field lines of a current-carrying conductor and including two components, one of the components extending substantially parallel to the direction of flow of the current and the other component extending substantially normal thereto, magnetic means for directing magnetic field lines of direct current through the body, polarizing means for directing a beam of polarized light into the body which beam is reflected through the body components, analyzer means for detecting rotation of the polarized light beam and for generating an output signal in response thereto, and electronic means responsive to the output signal for producing an electronic signal proportional to the current and compensated for temperature, loop degradation, and linearity.

The advantage of the device of this invention is that it offers a low cost method of providing approximate compensation of Faraday current sensors to replace wire wound current transformers.

DESCRIPTION OF THE PREFERRED EMBODIMENT

Figure 1:
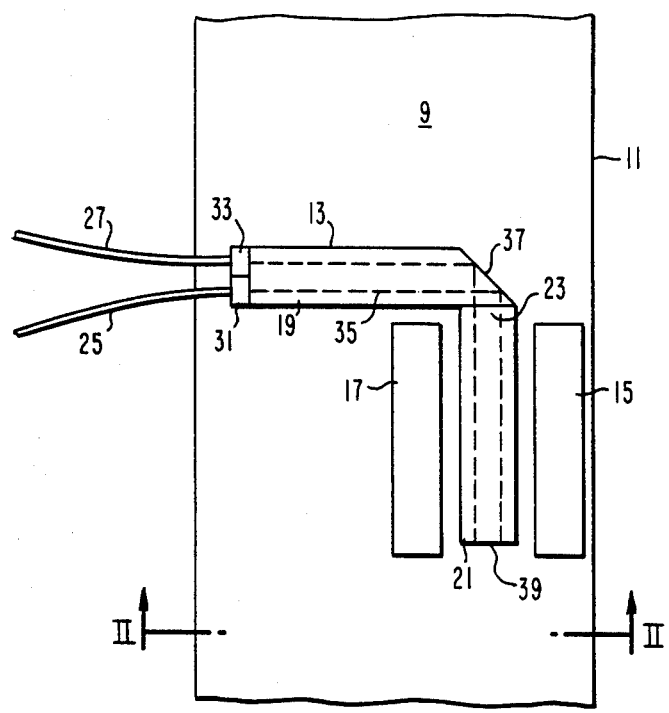
FIG. 1 is a schematic view of a current sensor disposed on the surface of an electrical conductor.

A temperature compensator structure is generally indicated at 9 (FIG. 1) and is located on a conductor 11 such as a bus bar. The structure 9 comprises a Faraday rotator or current sensor 13, and means for producing a DC current or permanent magnets 15, 17.

The Faraday rotator or current sensor 14 is a body of magneto-optical material exhibiting the Faraday effect in a magnetic field of a high current carrying conductor. Examples of such material including Hoya Faraday rotator glass or quartz. The current sensor 13 comprises a transverse component 19 and a longitudinal component 21, the former of which is perpendicular to the longitudinal axis or direction of movement of the current and the latter of which is parallel thereto. Components 19, 21 may be integral with each other, or they may be separate parts of the sensor, thereby the component 21 is in contact at 23 with one side of the transverse component 19.

Figure 2:
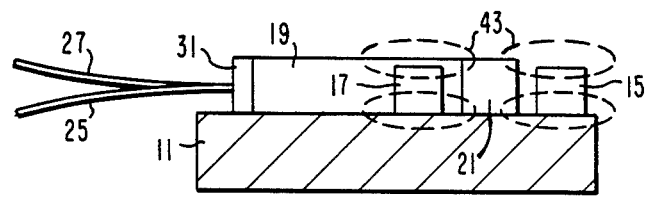
FIG. 2 is a vertical, sectional view taken on the line II—II of FIG. 1.
Figure 5:
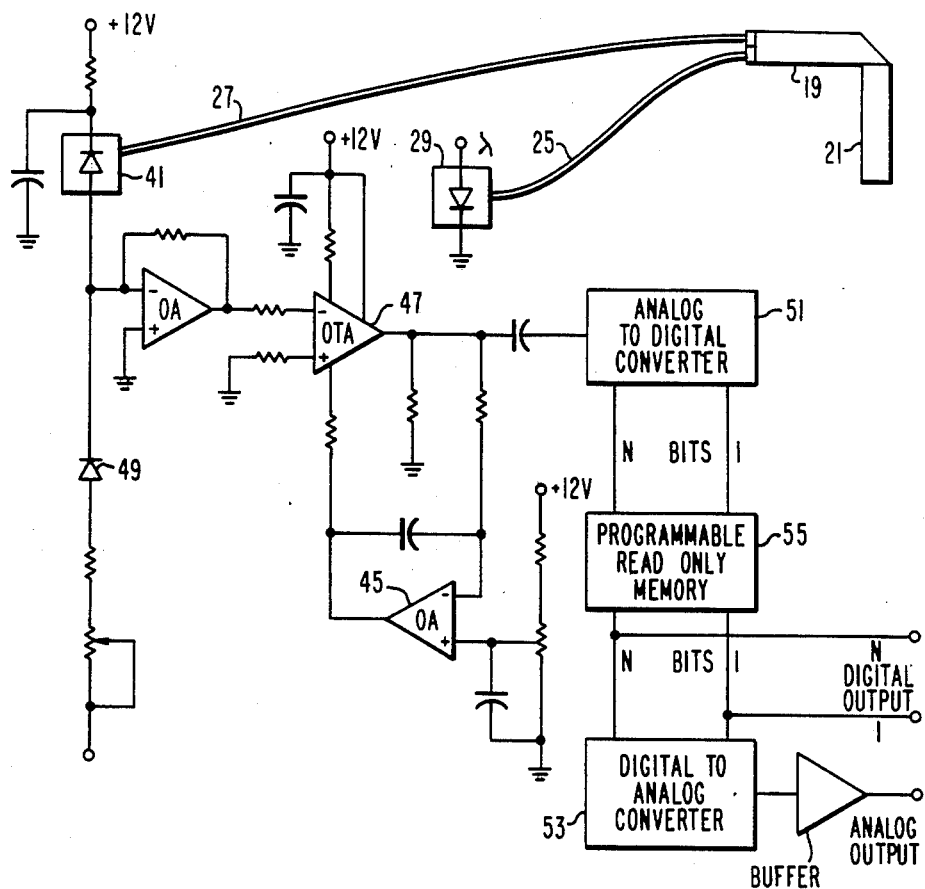
FIG. 5 is an electronic circuit which provides temperature and loop degradation compensation and linearization.

As shown in FIGS. 1 and 2 a pair of fiber optical cables 25, 27 are connected to the sensor 13. The cable 25 extends from a light source or LED 29 (FIG. 5) and is connected to an input polarizer 31 (FIGS. 1, 2). The cable 27 extends from an analyzer 33. Thus, from the polarizer 31, polarized light beams 35 extend through the transverse component 19 where they are reflected from a reflecting surface 37 through the longitudinal component 21 to a reflective end 39, and thence in the reverse direction to the reflecting surface 37 and to the analyzer 33 from where it is transmitted via the cable 27 to a photodiode 41 (FIG. 5).

The permanent magnets 15, 17, or any other means of providing DC magnetic fields 43, are disposed close enough to the longitudinal component 21 for the magnetic fields to influence the light rays or beams 35 within the sensor. As shown in FIGS. 1 and 2 the pair of magnets are preferably disposed on opposite sides of the longitudinal component 21 for the magnetic fields to sufficiently influence the light rays within the component.

As an alternative to connecting the cables 25, 27 and the polarizer 31 and analyzer 33 at the end of the transverse component 19, the parts may be connected to the end 39 of the component 21 with similar results. Thus, with the two piece Faraday current sensor 13 located on the AC conductor 11 and with magnets 15, 17 on one optical path length, the sensor is positioned to yield an AC and DC signal corresponding to current and temperature-loop degradation. The magnets 15, 17 provide a field to bias the operating point on the $\cos^2\chi$ curve in FIG. 3.

Figure 3:
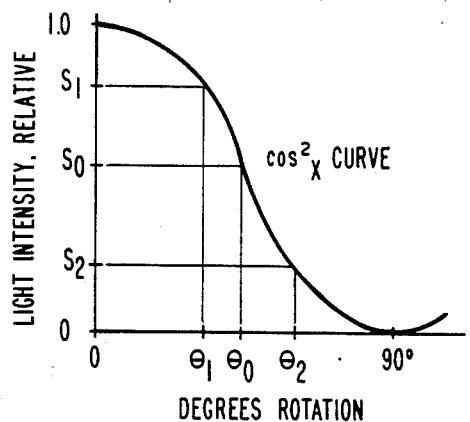
FIG. 3 is a graph of relative light intensity versus degrees of rotation.
Figure 4:
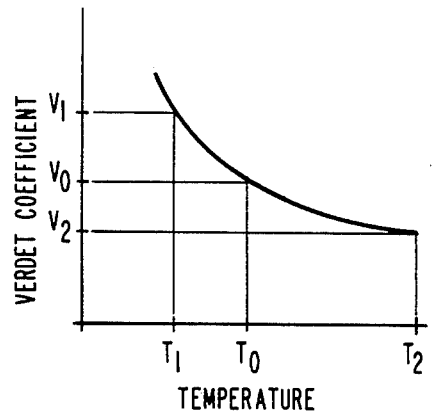
FIG. 4 is a graph showing the temperature dependence of Verdet coefficient of Faraday rotator material.

The placement of a Faraday rotator 21 90° to the AC magnetic field generated by the AC current carrying conductor provides a DC signal for the electronic circuit to compensate the AC signal variation due to temperature changes. For example, the input polarizer and the output analyzer are set at such a relative angle that the total DC output signal from the detector including the contribution from the permanent magnetic field $B_0$ on the Faraday rotator 21 is placed at $S_0$ as shown in FIG. 3. $\theta_0$ is the preset biased point, and corresponds to the normal operating temperature $T_0$. The Verdet coefficient is $V_0$ as shown in FIG. 4. If the temperature is increased to $T_2$, the Verdet coefficient decreases to a value of $V_2$, and the design of the rotator 21 is such that the decrease in DC signal, now at $S_2$, reflects the correct percentage of change of the Verdet coefficient, i.e.

$$(S_0 - S_2)\alpha(V_0 - V_2) \tag{1}$$

In the temperature range of interest (−40° C. to 140° C.) the change in Verdet coefficient for Hoya Faraday rotator glass is about ±15% from the room temperature value. Since the signal (S) following $\cos^2 \theta$ law, the designed value of the product $B_0 l$ is such that it yields the right percentage change of signal shown in equation (1). The electronic circuits sense the DC signal level change and adjust the gain in the AC section to compensate the temperature effect.

Compensation for temperature changes is provided over the entire temperature excursion required as shown in FIG. 4, wherein temperature dependence of the Verdet coefficient of the particular Faraday rotator material is indicated. Moreover, the input polarizer 31 and the analyzer 33 can be rotated to return the operating point of 45° where linearity is best. Temperature or loop transmission changes produce a DC change which is corrected by the feedback operational amplifier 45 OA (FIG. 5) altering the gain of the operational transconductances amplifier (OTA) 47 and thereby the AC signal representing the conductor current, because the AC signal at a given current level has a fixed ratio to the DC light level. A second identical photodiode (PIN) is used to provide a tracking source of dark current to balance out temperature effects in the active photodiode (PIN) 41.

Several methods may be employed to linearize the $\cos^2 \chi$ transfer curve (FIG. 3), but cost and response time must be considered. The $\cos^2 \chi$ function can be converted to a series approximation and treated digitally, but the process is slow. Arc sin negative and positive transfer functions can be synthesized in modules with cost a strong function of accuracy.

As shown in FIG. 5 a method of using an analog-to-digital convertor (ADC) 51 and digital-to-analog convertor (DAC) 53 with a programmable read-only memory 55 (PROM) between them in which $\cos^2 \chi$ values become addresses for corresponding linear values stored in the PROM 55. Accuracy is limited by the number of bits and the cost must be analyzed.

Figure 6:
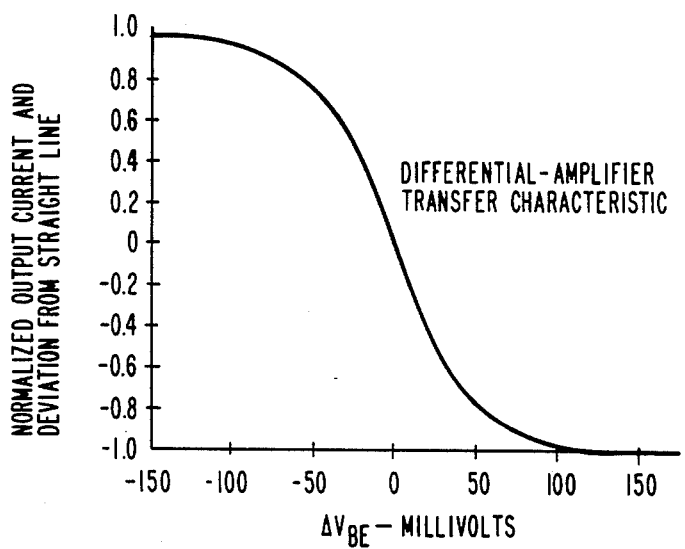
FIG. 6 is a graph showing transfer characteristics of operational transconductance amplifier (OTA) used in approximation linearization feedback circuit.

A simpler, less costly technique uses the differential input transfer characteristics of an operational transconductance amplifier 57 (OTA) (FIG. 7) in a feedback loop to generate a function that closely approximates the arc $\cos^2 \chi$ function over an arc range of from −80° to +80° (FIG. 6). FIG. 6 shows the transfer characteristics of operational transconductance amplifier (OTA) used in an approximation linearization feedback circuit. That is, the output-current transfer characteristics of the OTA is the same as that of an idealized differential amplifier.

As shown in FIG. 6 the transfer characteristics of the amplifier 61 matches the $\cos^2 \chi$ response curve very closely and when amplifier 57 is inserted in the feedback loop, the inverse function is generated with a resulting signal output being corrected for linearity. A $\cos^2 \chi$ input signal is converted to a straight line output signal so that the output signal corresponds very closely to the fields measured by the Faraday current sensor.

Figure 7:
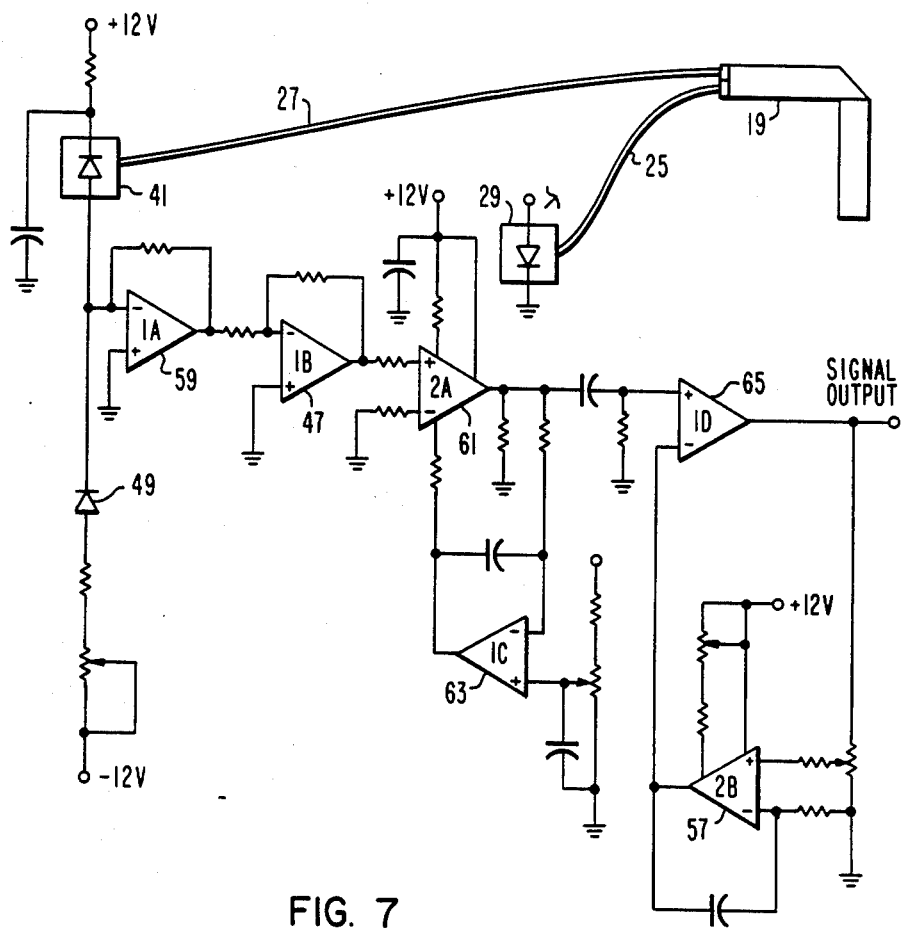
FIG. 7 is an electronic circuit for providing temperature and loop degradation compensation and linearization.

FIG. 7 shows an electronic circuitry to provide temperature and loop degradation compensation and linearization. More particularly, as shown in FIG. 7 the photodiode 41 is an optical detector supplying photo current to an operational amplifier 59 which performs a current-to-voltage conversion. The photodiode 49 provides dark current compensation over an operating temperature range. However, with the rapid improvement in device quality where dark currents do not exceed 1 to 3 nanoamps at 7° C., the photodiode 49 will not be required in most applications. The operational transconductance amplifier 47 is a 10X amplifier providing a signal to an operational transconductance amplifier 61. A gain of 2 A is controlled by an amplifier 63 operating in a feedback loop to maintain loop performance by sensing the continuous wave light level and correcting the AC signal level. An AC coupled amplifier 65 operates as a voltage follower with a linearity correcting feedback loop.

In conclusion, a Faraday sensor with two optical components in one module through which light passes through in a special manner produces a light signal containing temperature and current information about the conductor being measured. An associated electronic circuit which uses a DC light level to generate a correction signal for an AC value, representing the conductor current, compensates for temperature and loop degradation which includes the LED, optical fibers, connections and photodiodes. Finally, a feedback circuit utilizing a differential input characteristic of an operational transconductance amplifier generates an arc $\cos^2 \chi$ approximation that provides linearization of the output of the optical current sensor.

What is claimed is:

1. A device for measuring the current flowing through an electric conductor, comprising:
    (a) a body of magneto-optical material within the magnetic field lines of a current-carrying conductor and including two components;
    (b) one of the components extending substantially parallel to the direction of flow of the current and the other component extending substantially normal thereto;
    (c) magnetic means for directing magnetic field lines of direct current through the body;
    (d) polarizing means for directing a beam of polarized light into the body which beam is reflected through the body components;
    (e) analyzer means for detecting rotation of the polarized light beam and for generating an output signal in response thereto; and
    (f) electronic means responsive to the output signal for producing an electronic signal proportional to the current and compensated for temperature, loop degradation, and linearity.

2. The device of claim 1 in which the magnetic field lines are substantially perpendicular to the polarized light beams in the body.

3. The device of claim 2 in which the magnetic means is a permanent magnet.

4. The device of claim 3 in which the one component contacts and extends from one side of the other component.

5. The device of claim 4 in which one of the components includes a reflective surface for reflecting the light beam between the components.

* * * * *